United States Patent
Lee et al.

(10) Patent No.: US 11,217,771 B2
(45) Date of Patent: Jan. 4, 2022

(54) DISPLAY DEVICE AND METHOD OF MANUFACTURING THE SAME

(71) Applicant: Samsung Display Co., Ltd., Yongin-si (KR)

(72) Inventors: Kwang Soo Lee, Gwangmyeong-si (KR); Jong Hyun Yun, Gwangmyeong-si (KR)

(73) Assignee: SAMSUNG DISPLAY CO. LTD., Gyeonggi-Do (KR)

(*) Notice: Subject to any disclaimer, the term of this patent is extended or adjusted under 35 U.S.C. 154(b) by 0 days.

(21) Appl. No.: 16/865,274

(22) Filed: May 1, 2020

(65) Prior Publication Data

US 2020/0259121 A1 Aug. 13, 2020

Related U.S. Application Data

(63) Continuation of application No. 16/519,944, filed on Jul. 23, 2019, now Pat. No. 10,644,261, which is a continuation of application No. 15/945,492, filed on Apr. 4, 2018, now Pat. No. 10,396,311.

(30) Foreign Application Priority Data

Sep. 4, 2017 (KR) .......................... 10-2017-0112640

(51) Int. Cl.
*H01L 51/52* (2006.01)
*H01L 51/56* (2006.01)
*H01L 51/00* (2006.01)

(52) U.S. Cl.
CPC .......... *H01L 51/5253* (2013.01); *H01L 51/56* (2013.01); *H01L 51/0097* (2013.01)

(58) Field of Classification Search
CPC .. H01L 51/5253; H01L 51/56; H01L 51/0097
See application file for complete search history.

(56) References Cited

U.S. PATENT DOCUMENTS

| 7,812,527 | B2 | 10/2010 | Kim et al. |
| 9,000,600 | B2 | 4/2015 | Uzoh et al. |
| 9,818,807 | B2 | 11/2017 | Park |
| 10,005,263 | B2 | 6/2018 | Jung et al. |
| 2017/0031323 | A1* | 2/2017 | Kim .................... H01L 27/3258 |

FOREIGN PATENT DOCUMENTS

| KR | 1020080056030 | 6/2008 |
| KR | 1020120042151 | 5/2012 |
| KR | 1020150032791 | 3/2015 |
| KR | 1020160077554 | 7/2016 |
| KR | 1020160087982 | 7/2016 |
| KR | 1020160104790 | 9/2016 |
| KR | 1020170015632 | 2/2017 |
| KR | 1020180076429 | 7/2018 |

* cited by examiner

*Primary Examiner* — Karen Kusumakar
(74) *Attorney, Agent, or Firm* — Cantor Colburn LLP

(57) ABSTRACT

A display device includes: an insulating substrate, where a through hole is defined through the insulating substrate; and an organic layer which covers the insulating substrate. In the display device, a barrier area surrounding the through hole is defined in the insulating substrate, and an interruption portion, at which the organic layer is interrupted, is defined in the barrier area.

9 Claims, 20 Drawing Sheets

DISPLAY DEVICE AND METHOD OF MANUFACTURING THE SAME

This application is a continuation of U.S. patent application Ser. No. 16/519,944, filed on Jul. 23, 2019, which is a continuation of U.S. patent application Ser. No. 15/945,492, filed on Apr. 4, 2018, which claims priority to Korean Patent Application No. 10-2017-0112640, filed on Sep. 4, 2017, and all the benefits accruing therefrom under 35 U.S.C. 119, the content of which in its entirety is herein incorporated by reference.

BACKGROUND

1. Field

Embodiments of the invention relate to a display device and a method of manufacturing the display device.

2. Description of the Related Art

Among various types of display device, an organic light emitting display device has been drawing attention as next-generation display device due to desired characteristic thereof, e.g., wide viewing angle, high contrast, and fast response speed.

Generally, an organic light emitting display device includes thin film transistors and organic light emitting diodes on a substrate for self-light emission. Such an organic light emitting display device may be used as a display unit of a small electronic device such as a mobile phone or a display unit of a large electronic device such as a television.

In particular, flexible display devices among organic light emitting displays are being actively researched as the interest in the flexible display devices increases. In order to realize a flexible display device, a flexible substrate made of a material such as synthetic resin is used instead of a conventional glass substrate.

SUMMARY

However, since a flexible substrate is flexible, it is not easy to handle the flexible substrate in a manufacturing process. Therefore, the flexible substrate may be formed on a support substrate having sufficient rigidity for various processes and then may be separated from the support substrate, to effectively handle the flexible substrate in a manufacturing process.

Embodiments of the invention provide a display device which prevents moisture from flowing into a display area.

According to an embodiment of the invention, there is provided a display device including: an insulating substrate, where a through hole is defined through the insulating substrate; and an organic layer which covers the insulating substrate. In such an embodiment, a barrier area surrounding the through hole is defined in the insulating substrate, and an interruption portion, at which the organic layer is interrupted, is disposed in the barrier area.

In an embodiment, a groove may be defined on the insulating substrate in the barrier area.

In an embodiment, the groove may include a first sidewall and a second sidewall spaced apart from each other, and the interruption portion may be defined by the first sidewall.

In an embodiment, a slope of the first sidewall and a slope of the second sidewall may be substantially the same as each other.

In an embodiment, the display device may further include an electrode which covers the organic layer, where the electrode may be interrupted at the interruption portion.

In an embodiment, the electrode may contact the first sidewall and may not contact the second sidewall.

In an embodiment, a display area, which displays an image, and a non-display area, which is disposed outside the display area, may be defined in the insulating substrate, and the through hole may be defined in the display area.

In an embodiment, the insulating substrate may include a first substrate, an inorganic layer and a second substrate, which are stacked sequentially one on another, and the groove may be defined in the second substrate.

In an embodiment, a planar shape of the groove may be a ring shape surrounding the through hole.

In an embodiment, a dam area surrounding the barrier area may be defined in the insulating substrate outside the barrier area, and a dam may be disposed on the insulating substrate in the dam area.

In an embodiment, the dam may be provided in plural, and the dams may include a first dam and a second dam spaced apart from the first dam.

In an embodiment, a display area, which displays an image, and a non-display area, which is disposed outside the display area, may be defined in the insulating substrate, and the through hole may be defined in the display area.

In an embodiment, the display area may include a first electrode and a second electrode opposite to the first electrode, and the organic layer may be disposed between the first electrode and the second electrode.

In an embodiment, the organic layer may include an organic light emitting layer.

In an embodiment, a display area, which displays an image, and a non-display area, which is disposed outside the display area, may be defined in the insulating substrate, and the through hole may be defined in the non-display area.

According to another embodiment of the invention, a method of manufacturing a display device includes: providing a dam on a first area of an insulating substrate, where the insulating substrate is disposed on a carrier substrate, and the first area, a second area and a third area are defined in the insulating substrate; forming a laser cutting portion by irradiating a laser beam to the third area in a first direction; forming a groove in the insulating substrate by irradiating a laser beam to the second area in a second direction different from the first direction; and providing an organic layer on the insulating substrate to at least partially cover the grooves, where an interruption portion, at which the organic layer is interrupted, is formed in the second area.

In an embodiment, the method may further include: detaching the carrier substrate from the insulating substrate; and attaching a protective film to a lower surface of the insulating substrate.

In an embodiment, the method may further include forming a through hole by cutting off a portion of the protective film corresponding to the third area.

In an embodiment, the groove may include a first sidewall and a second sidewall spaced apart from each other, and the interruption portion may be defined by the first sidewall.

In an embodiment, the method may further include providing an electrode on the insulating substrate to cover the organic layer.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1:
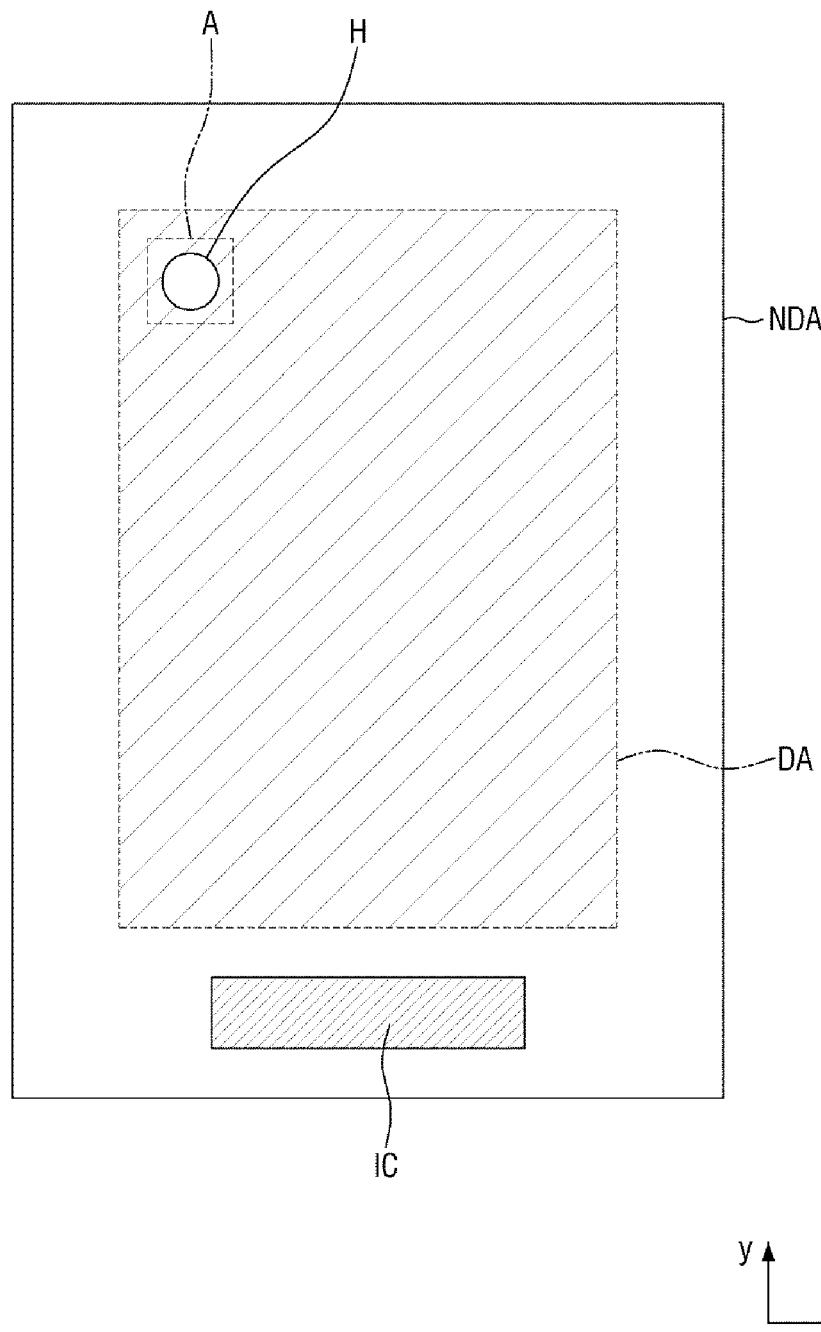
FIG. 1 is a schematic plan view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 2:
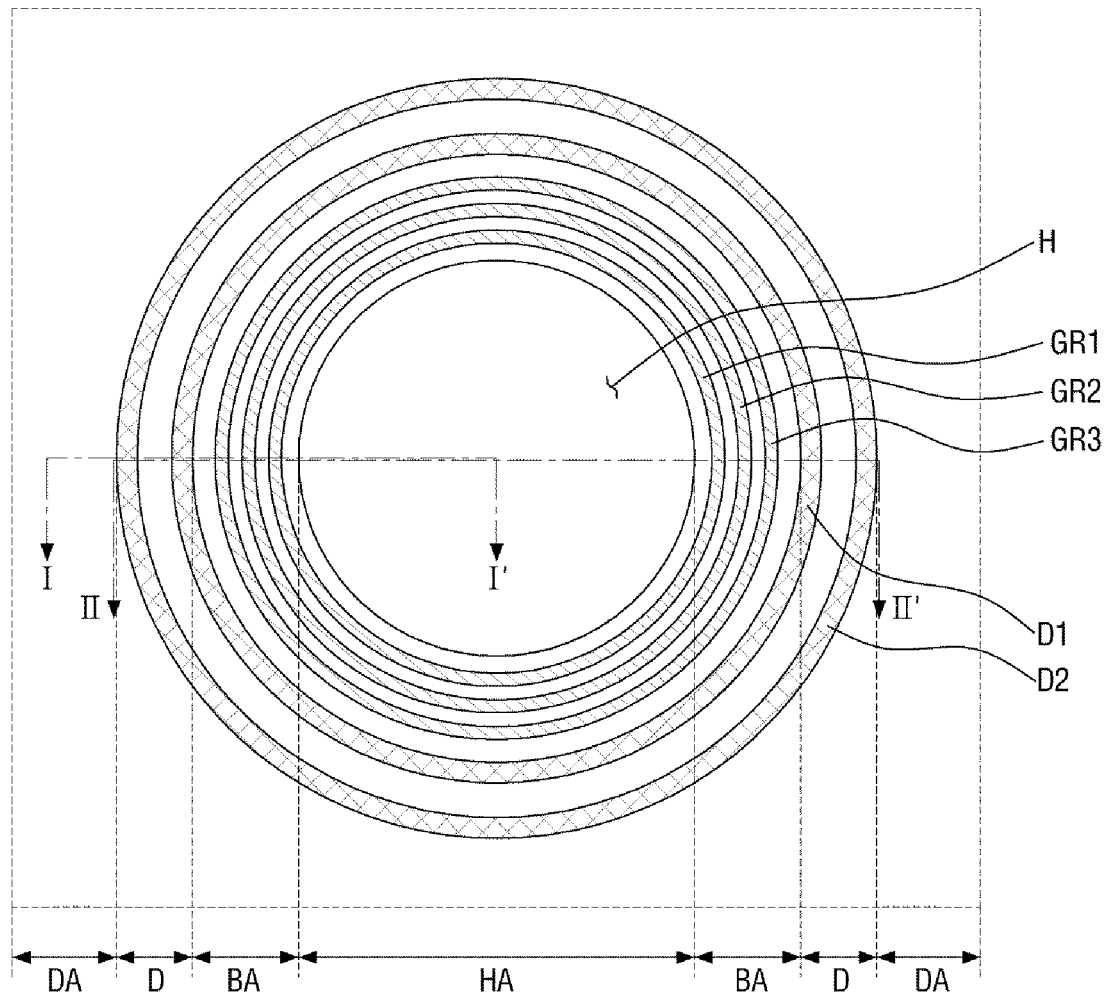
FIG. 2 is an enlarged view of a portion 'A' of FIG. 1.
Figure 3:
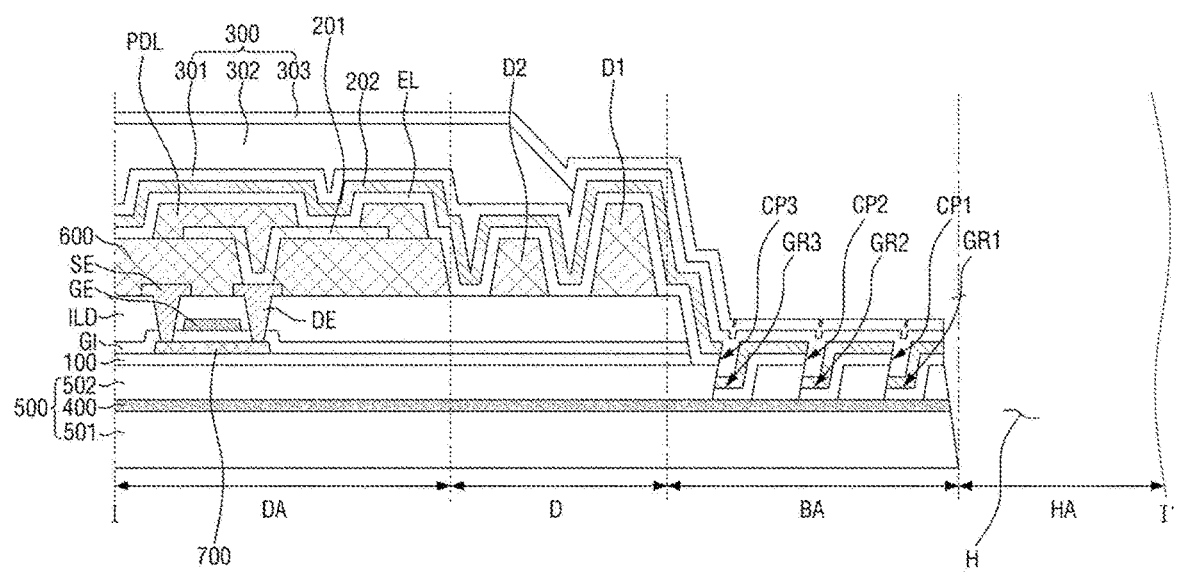
FIG. 3 is a cross-sectional view taken along line I-I' of FIG. 2.
Figure 4:
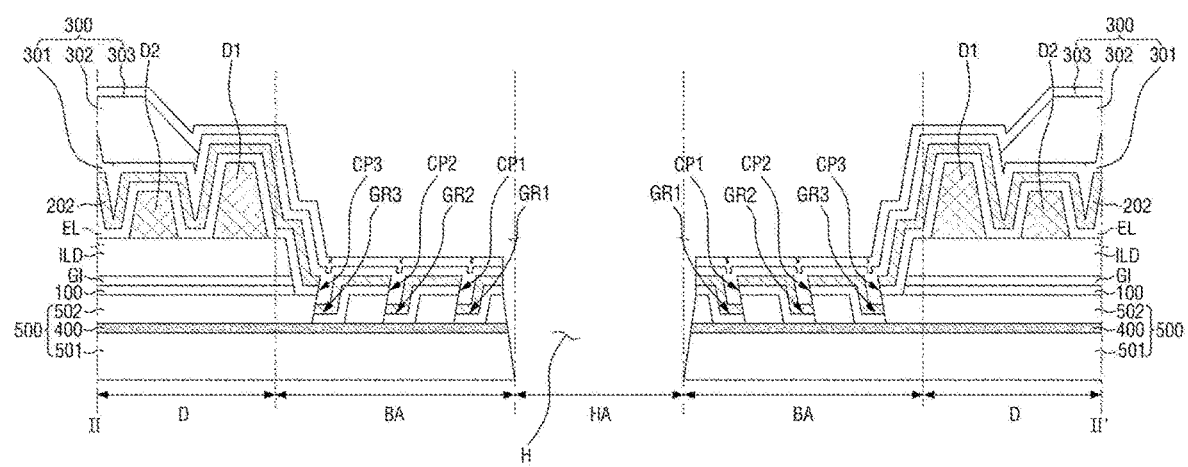
FIG. 4 is a cross-sectional view taken along line II-II' of FIG. 2.
Figure 5:
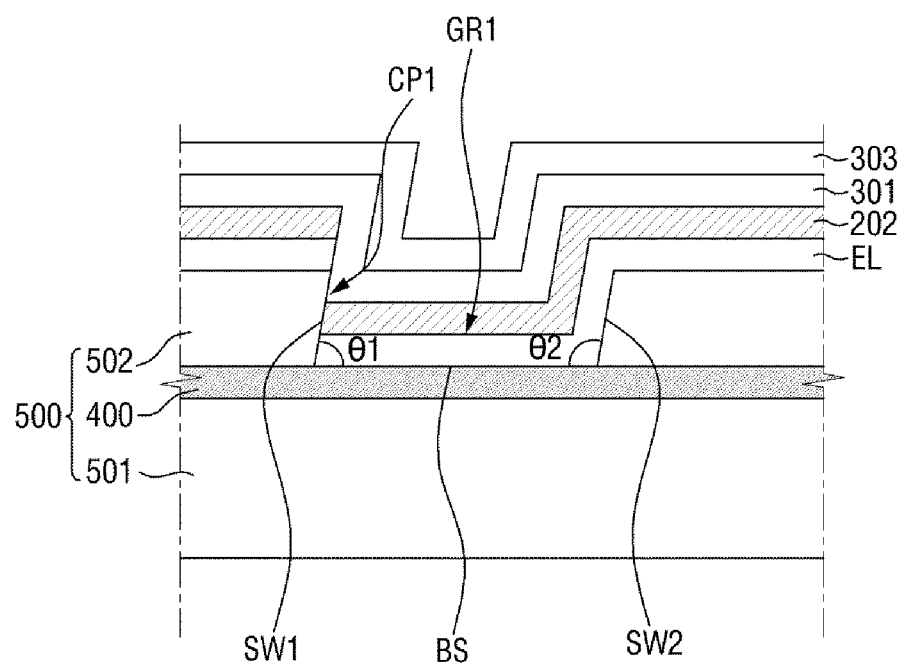
FIG. 5 is an enlarged view of a portion of FIG. 3.

FIG. 1 is a schematic plan view of a display device according to an embodiment. FIG. 2 is an enlarged view of a portion 'A' of FIG. 1. FIG. 3 is a cross-sectional view taken along line I-I' of FIG. 2. FIG. 4 is a cross-sectional view taken along line II-II' of FIG. 2. FIG. 5 is an enlarged view of a portion of FIG. 3.

Referring to FIGS. 1 through 5, an embodiment of the display device includes an insulating substrate 500, through which a through hole H is defined, and an organic layer EL covering the insulating substrate 500.

The insulating substrate 500 may include a first substrate 501 and a second substrate 502. In an embodiment, the first substrate 501 and/or the second substrate 502 may include or be made of at least one of polyimide, polyethylene terephthalate ("PET"), polycarbonate, polyethylene naphtalate, polyarylate ("PAR"), and polyetherimide. However, the materials of the first substrate 501 and the second substrate 502 are not limited thereto.

In an alternative embodiment, the insulating substrate 500 may include a material such as metal or glass.

In an embodiment, the insulating substrate 500 may be a flexible substrate. In such an embodiment, the insulating substrate 500 may be a flexible substrate that is capable of being bent, rolled or folded.

In an embodiment, the insulating substrate 500 may include the first substrate 501, an inorganic layer 400 and the second substrate 502, which are stacked sequentially one on another (see FIG. 3).

In an embodiment where the insulating substrate 500 is a flexible substrate, the first substrate 501 and the second substrate 502 may include polyimide ("PI").

In an embodiment, the inorganic layer 400 may include at least one of silicon oxide (SiOx), silicon nitride (SiNx) and silicon oxynitride (SiONx).

A display area DA and a non-display area NDA may be defined in the insulating substrate 500. The display area DA is an area in which an image is displayed, and the non-display area NDA is an area which is disposed outside the display area DA and in which various signal lines and power supply lines are arranged to display the image in the display area DA.

A plurality of pixels (not illustrated) may be defined in the display area DA, and a thin film transistor and an organic light emitting diode may be disposed in each pixel. This will be described later in greater detail.

A driver integrated circuit IC may be disposed on a side of the non-display area NDA. In one embodiment, for example, the driver integrated circuit IC may be mounted directly on the insulating substrate 500. Although a single driver integrated circuit IC is illustrated in FIG. 1, the number of driver integrated circuits IC is not limited thereto. In an alternative embodiment, a plurality of driver integrated circuits IC may be disposed on the non-display area NDA.

The driver integrated circuit IC may generate a plurality of scan signals and/or a plurality of data signals, and provide the scan signals and/or the data signals to the pixels of the display area DA. In such an embodiment, a plurality of signal lines (not illustrated) for electrically connecting the driver integrated circuit IC to the pixels may be disposed on the insulating substrate 500.

In an embodiment of the display device, the through hole H may be defined through the insulating substrate 500.

In such an embodiment, the through hole H may form an opening extending from an upper surface to a lower surface of the insulating substrate 500.

In an embodiment, the through hole H may be disposed inside the display area DA when viewed from a plan view in a thickness direction of the display device. The through hole H and elements disposed adjacent to the through hole H will now be described with reference to FIG. 2.

A hole area HA, which is an area occupied by the through hole H, is defined in the display device. In an embodiment, as shown in FIGS. 1 and 2, the planar shape of the through hole H may be a circular shape. In an alternative embodiment, the planar shape of the through-hole H may be a polygonal or elliptical shape. In an embodiment, the planar shape of the through hole H may be a shape including straight lines and curves.

A barrier area BA may be defined as an area surrounding the through hole H. In an embodiment where the planar shape of the through hole H is a circular shape, an outer boundary of the barrier area BA may be circular. In such an embodiment, the outer boundary of the barrier area BA may be concentric with an outer boundary of the through hole H.

In such an embodiment, a groove may be disposed in the barrier area BA.

In an embodiment, a first groove GR1, a second groove GR2 and a third groove GR3 may be defined in the barrier area BA of the substrate 500. The first grooves GR1, the second grooves GR2 and the third grooves GR3 may be arranged to surround the through hole H. In such an embodiment, the planar shapes of the first groove GR1, the second groove GR2 and the third groove GR3 may be ring shapes surrounding the through hole H.

In an embodiment, as shown in FIG. 2, three grooves, i.e., the first groove GR1, the second groove GR2 and the third groove GR3, are arranged in the barrier area BA. However, the number of grooves is not limited to three. In an alternative embodiment, the number of grooves may be various modified. e.g., four or more.

In an embodiment, the first groove GR1, the second groove GR2 and the third groove GR3 may be sequentially arranged outside the through hole H. In an embodiment where the through hole H is circular, the first groove GR1, the second groove GR2 and the third groove GR3 may have shapes of concentric circles that have the center of the through hole H as the center thereof when viewed from the plan view.

A dam area D may be defined as an area surrounding the barrier area BA. In an embodiment, a plurality of dams may be disposed in the dam area D. In an embodiment, a first dam D1 and a second dam D2 may be disposed in the dam area D, as shown in FIG. 2, but the number of dams is not limited to two. In an alternative embodiment, the number of dams may be one or may be three or more.

In an embodiment, as described above, the through hole H may be disposed inside the display area DA. In such an embodiment where the through hole H is disposed inside the display area DA, the display area DA may be disposed outside the dam area D.

The cross-sectional shape of an embodiment of the display device t will now be described in greater detail with reference to FIGS. 3 and 4.

In an embodiment, as described above, the insulating substrate 500 may be a flexible substrate. In an embodiment, the insulating substrate 500 may include the first substrate 501, the inorganic layer 400 and the second substrate 502 stacked sequentially one on another, and the first substrate 501 and the second substrate 502 may include PI.

A buffer layer 100 may be disposed on the second substrate 502. In an embodiment, the buffer layer 100) may be disposed in the display area DA and the dam area D. The buffer layer 100 may not be provided in the hole area HA. The buffer layer 100 may be partially provided in the barrier area BA or may not be provided in the barrier area BA.

The buffer layer 100 may effectively prevent impurities passed through the second substrate 502 from penetrating into layers thereabove, and may planarize an upper surface of the second substrate 502.

In an embodiment, the buffer layer 100 may include at least one of silicon oxide, silicon nitride, silicon oxynitride, aluminum oxide, aluminum nitride, titanium oxide, and titanium nitride.

In an embodiment, the buffer layer 100 may include at least one of polyimide, polyester, and acrylic.

In an embodiment, as shown in FIG. 3, the buffer layer 100 may have a single layer structure. However, the structure of the buffer layer 100 is not limited to the single layer structure. In an alternative embodiment, the buffer layer 100 may have a multi-layer structure including a stack of a plurality of functional films.

A semiconductor pattern layer 700 may be disposed on the buffer layer 100. In an embodiment, the semiconductor pattern layer 700 may include an inorganic semiconductor such as amorphous silicon or polysilicon. In an alternative embodiment, the semiconductor pattern layer 700 may include an organic semiconductor or an oxide semiconductor.

In an embodiment, the semiconductor pattern layer 700 may include a source region (not illustrated) and a drain region (not illustrated). A source electrode SE to be described later may be electrically connected to the source region of the semiconductor pattern layer 700, and a drain electrode DE to be descried later may be electrically connected to the drain region of the semiconductor pattern layer 700.

A gate insulating film GI may be disposed on the semiconductor pattern layer 700. The gate insulating film GI may be provided in the display area DA and the dam area D. The gate insulating film GI may not be provided in the hole area HA. The gate insulating film GI may be partially provided in the barrier area BA or may not be provided in the barrier area BA.

In an embodiment, an end of the gate insulating film GI and an end of the buffer layer 100 may be aligned with each other. In such an embodiment, a sidewall of the gate insulating film GI and a sidewall of the buffer layer 100 may be aligned with each other as illustrated in FIG. 3.

In an embodiment, the gate insulating film GI may include at least one of silicon nitride, silicon oxide, and silicon oxynitride.

A gate electrode GE may be disposed on the gate insulating film GI. The gate electrode GE may include at least one of an aluminum (Al)-based metal including an aluminum alloy, a silver (Ag)-based metal including a silver alloy, a copper (Cu)-based metal including a copper alloy, a molybdenum (Mo)-based metal including a molybdenum alloy, chrome (Cr), titanium (Ti) and tantalum (Ta).

An interlayer insulating film ILD may be disposed on the gate electrode GE to cover the gate electrode GE. The interlayer insulating film ILD may be provided in the display region DA and the dam area D. The interlayer insulating film ILD may not be provided in the hole area HA. The interlayer insulating film ILD may be partially provided in the barrier area BA or may not be provided in the barrier area BA.

In an embodiment, an end of the interlayer insulating film ILD and an end of the gate insulating film GI may be aligned with each other. In such an embodiment, a sidewall of the interlayer insulating film ILD and a sidewall of the gate insulating film GI may be aligned with each other. In such an embodiment, the sidewalls of the interlayer insulating film ILD, the gate insulating film GI and the buffer layer 100 may be aligned with each other.

In an embodiment, as shown in FIGS. 3 and 4, the interlayer insulating film ILD is a single film. However, the interlayer insulating film ILD is not necessarily a single film. In an alternative embodiment, the interlayer insulating film ILD may be a stack of two or more functional layers.

The source electrode SE and the drain electrode DE are disposed on the interlayer insulating film ILD. In an embodiment, the interlayer insulating film ILD may expose the source region and the drain region of the semiconductor pattern layer 700, and the source electrode SE and the drain electrode DE may contact the semiconductor pattern layer 700 through the exposed source and drain regions. Accordingly, each of the source electrode SE and the drain electrode DE may be electrically connected to the semiconductor pattern layer 700.

In an embodiment, the gate electrode GE, the source electrode SE, and the drain electrode DE may collectively define a thin film transistor.

The thin film transistor may be a driving transistor for driving an organic light emitting diode.

In an embodiment, as shown in FIG. 3, a top gate-type display device in which the gate electrode GE is disposed on the semiconductor pattern layer 700 is illustrated. However, the display device is not limited to the top gate-type display device. In an alternative embodiment, the display device may employ a bottom gate type in which the gate electrode GE is disposed under the semiconductor pattern layer 700.

A passivation film 600 may be disposed on the source electrode SE, the drain electrode DE and the interlayer insulating film ILD. The passivation film 600 may partially cover the interlayer insulating film ILD. In such an embodiment, the passivation film 600 may partially expose the drain electrode DE.

A first electrode 201, the organic layer EL and a second electrode 202 may be disposed on the passivation film 600. The first electrode 201, the organic layer EL and the second electrode 202 may collectively define an organic light emitting diode.

In an embodiment, the first electrode 201 may be an anode. The first electrode 201 may be disposed on the passivation film 600 and may contact the drain electrode DE exposed by the passivation film 600. In such an embodiment, the first electrode 201 may be electrically connected to the drain electrode DE.

In an embodiment, the first electrode 201 may be a reflective electrode. In such an embodiment, the reflective electrode may include a reflective film including at least one of Ag, Mg, Al, Pt, Pd, Au, Ni, Nd, Ir and Cr, and a transparent or translucent electrode disposed on the reflective films.

The transparent or translucent electrode may include at least one of indium tin oxide ("ITO"), indium zinc oxide ("IZO"), zinc oxide (ZnO), indium oxide ($In_2O_3$), indium gallium oxide ("IGO"), and aluminum zinc oxide ("AZO").

A pixel defining layer PDL including an insulating material may be disposed on the first electrode 201. The pixel defining layer PDL may expose at least part of the first electrode 201.

The organic layer EL may be disposed on the pixel defining layer PDL and the first electrode 201. The organic layer EL may include an organic light emitting layer including a low molecular weight or high molecular organic material.

In an embodiment, the organic light emitting layer may emit light of one of a red color, a green color and a blue color.

In such an embodiment, in an embodiment, the organic layer EL may further include at least one of a hole transfer layer ("HTL"), a hole injection layer ("HIL"), an electron transfer layer ("ETL"), and an electron injection layer ("EIL").

In an embodiment, the organic layer EL may cover at least part of the insulating substrate 500. In such an embodiment, the organic layer EL may at least partially cover the display area DA, the dam area D and the barrier area BA.

The second electrode 202 may be disposed on the organic layer EL. In an embodiment, the second electrode 202 may be a cathode.

In an embodiment, the second electrode 202 may be a whole-surface electrode covering an entire surface of the insulating substrate 500.

The second electrode 202 may cover the organic layer EL. In an embodiment where the organic layer EL covers the display area DA, the non-display area NDA, the dam area D and the barrier area BA, the second electrode 202 may cover the display area DA, the non-display area NDA, the dam area D and the barrier area BA.

In an embodiment, the second electrode 202 may be a transparent electrode or a translucent electrode. In an embodiment, the second electrode 202 may include at least one of Li, Ca, LiF/Ca, LiF/Al, Al, Ag, and Mg. In an embodiment, the second electrode 202 may include or be made of a metal thin film having a low work function.

In an embodiment, the transparent or translucent electrode may include at least one of ITO, IZO, zinc oxide (ZnO), indium oxide (In$_2$O$_3$), IGO and AZO.

In an embodiment, the display device may be a top emission-type display device in which light generated from the organic layer EL is emitted toward the second electrode 202.

In an alternative embodiment, the display device may be a bottom emission-type display device in which light generated from the organic layer EL is emitted toward the first electrode 201. In such an embodiment, the second electrode 202 may be a reflective electrode, and the first electrode 201 may be a transparent or translucent electrode.

In another alternative embodiment, the display device may be a double-sided emission-type display device in which light generated from the organic layer EL is emitted toward the first electrode 201 and the second electrode 202.

An encapsulation film 300 may be disposed on the second electrode 202. In an embodiment, the encapsulation film 300 may include a first inorganic film 301, a first organic film 302, and a second inorganic film 303.

The first inorganic film 301 may include at least one of silicon oxide (SiOx), silicon nitride (SiNx), and silicon oxynitride (SiONx).

In an embodiment, as shown in FIGS. 3 and 4, the first inorganic film 301 may have a single layer structure. However, the structure of the first inorganic film 301 is not limited to the single layer structure. In an alternative embodiment, the first inorganic film 301 may have a multi-layer structure including a stack of a plurality of functional films.

In an embodiment, the first inorganic film 301 may be a film in which a film made of silicon oxide (SiOx) and a film made of silicon nitride (SiNx) are alternately stacked one on another. The first organic film 302 may be disposed on the first inorganic film 301. The first organic film 302 may be disposed on the first inorganic film 301 and may have a thickness great enough to planarize a step formed by the pixel defining layer PDL, for example, may have a thickness of about 30000 angstrom (A).

In an embodiment, the first organic layer 302 may include at least one of epoxy, acrylate and urethane acrylate.

The second inorganic film 303 may be disposed on the first organic film 302. The second inorganic film 303 may include at least one of silicon oxide (SiOx), silicon nitride (SiNx), and silicon oxynitride (SiONx).

In FIG. 3, the second inorganic film 303 may have a single layer structure. However, the structure of the second inorganic film 303 is not limited to the single layer structure. In an alternative embodiment, the second inorganic film 303 may have a multi-layer structure including a stack of a plurality of functional films. In an embodiment, the second inorganic film 303 may be a film in which a film made of silicon oxide (SiOx) and a film made of silicon nitride (SiNx) are alternately stacked one on another.

Next, the dam area D will be described in detail.

The buffer layer 100, the gate insulating film GI and the interlayer insulating film ILD may be disposed in the dam area D. In an embodiment, as shown in FIG. 3, an inorganic film consisting of three layers, that is, the buffer layer 100, the gate insulating film GI and the interlayer insulating film ILD is disposed in the dam area D. However, the inorganic film formed in the dam area D is not limited thereto. In an alternative embodiment, an inorganic film consisting of at least one layer may be disposed in the dam area D, and the at least one layer may be made of a same material as one of the buffer layer 100, the gate insulating film GI and the interlayer insulating film ILD.

The first dam D1 and the second dam D2 may be disposed on the interlayer insulating film ILD. The first dam D1 is spaced apart from the through hole H.

In an embodiment, the first dam D1 may define the barrier area BA In such an embodiment, the barrier area BA may be defined as an area between the first dam D1 and the through hole H.

In an embodiment, the first dam D1 may include or be made of a same material as the pixel defining layer PDL of the display area DA. In such an embodiment, the first dam D1 may be disposed on a same layer as the pixel defining layer PDL. In such an embodiment, the first dam D1 may be formed with the pixel defining layer PDL during a same process. However, the invention is not limited to this case. In an alternative embodiment, the first dam D1 may be formed independently of the pixel defining layer PDL.

The second dam D2 may be spaced apart from the first dam D1. The second dam D2 may be disposed between the display area DA and the first dam D1. A height of the second dam D2 may be different from that of the first dam D1. The height of the second dam D2 may be less than that of the first dam D1. However, the invention is not limited thereto. In an alternative embodiment, the height of the second dam D2 may be substantially the same as that of the first dam D1.

In an embodiment, the second dam D2 may be made of a same material as the passivation film 600 of the display area DA. In such an embodiment, the second dam D2 may be formed with the passivation film 600 during a same process. However, the invention is not limited thereto. In an alternative embodiment, the second dam D2 may be formed independently of the passivation film 600.

The encapsulation film 300 may be disposed on the first dam D1 and the second dam D2.

The first inorganic film 301, the first organic film 302 and the second inorganic film 303 may be disposed on the second dam D2.

In an embodiment, only the first inorganic film 301 and the second inorganic film 303 may be disposed on the first dam D1, and the first organic film 302 may not be disposed on the first dam D1.

In such an embodiment, while an upper surface of the second dam D2 overlaps the first organic film 302, an upper surface of the first dam D1 may not overlap the first organic film 302.

In such an embodiment, the first inorganic film 301 and the second inorganic film 303 may directly contact each other on the first dam D1.

Next, the barrier area BA will be described in detail.

In an embodiment, inorganic films may be removed from the barrier area BA or may be partially present in the barrier area BA In an embodiment, the barrier area BA may include the first groove GR1, the second groove GR2 and the third groove GR3.

As described above with reference to FIG. 2, the outer circumferences of the first groove GR1, the second groove GR2 and the third groove GR3 may have shapes of concentric circles with different diameters. The first groove GR1, the second groove GR2 and the third groove GR3 may have substantially the same cross-sectional shape as each other.

In an embodiment, as shown in FIGS. 3 and 4, the first groove GR1, the second groove GR2 and the third groove GR3 have substantially the same width as each other. However, the invention is not limited thereto. In an alternative embodiment, the first groove GR1, the second groove GR2, and the third groove GR3 may have different widths from each other.

Next, the hole area HA will be described in detail.

In an embodiment, as described above, the through hole H may be defined in the hole area HA. In an embodiment, both sidewalls defining the through hole H may be tapered. In such an embodiment, as illustrated in FIG. 4, a cross-section of the through hole H may become narrower from the upper surface of the insulating substrate 500 toward a lower surface of the insulating substrate 500.

The cross-sectional shape of the first groove GR1 will now be described in greater detail with reference to FIG. 5.

FIG. 5 is an enlarged view of a portion of FIG. 3.

Referring to FIG. 5, the first groove GR1 may include a first sidewall SW1, a bottom surface BS and a second sidewall SW2.

The bottom surface BS may be disposed between the first sidewall SW1 and the second sidewall SW2.

In an embodiment, the bottom surface BS may be defined by an upper surface of the inorganic layer 400. In such an embodiment, the first groove GR1 may pass through the second substrate 502 but may not pass through the inorganic layer 400 and the first substrate 501. In such an embodiment, the bottom surface BS may be defined by the inorganic layer 400, and the first sidewall SW1 and the second sidewall SW2 may be defined by side walls of the second substrate 502.

In an embodiment, a height of the first groove GR1, that is, a distance from the upper surface of the second substrate 502 to the bottom surface BS may be 5.8 micrometers (μm) or greater.

In an embodiment, the first sidewall SW1 may form a first angle θ1 with the bottom surface BS. Here, the first angle θ1 may be an acute angle. When the first angle θ1 is an acute angle, the first sidewall SW1 extending from the upper surface of the second substrate 502 may slope steeply.

The second sidewall SW2 may form a second angle θ2 with the bottom surface BS. In an embodiment, the sum of the second angle θ2 and the first angle θ1 may be about 180 degrees.

In such an embodiment, the second sidewall SW2 and the first sidewall SW1 may extend parallel to each other.

This will be described later in terms of slope. The slope of a sidewall may be defined in cross-section. In an embodiment, the slope may be defined as a value obtained by dividing the amount of change in a y-axis direction by the amount of change in an x-axis direction in a coordinate plane system consisting of the x-axis and the y-axis shown in FIG. 5. Herein, the slope refers to the degree to which a plane or line is inclined with respect to the x-axis.

In such an embodiment, each of the first sidewall SW1 and the second sidewall SW2 may have a positive slope or a negative slope. In such an embodiment, the first sidewall SW1 and the second sidewall SW2 may have substantially the same slope as each other.

Figure 6:
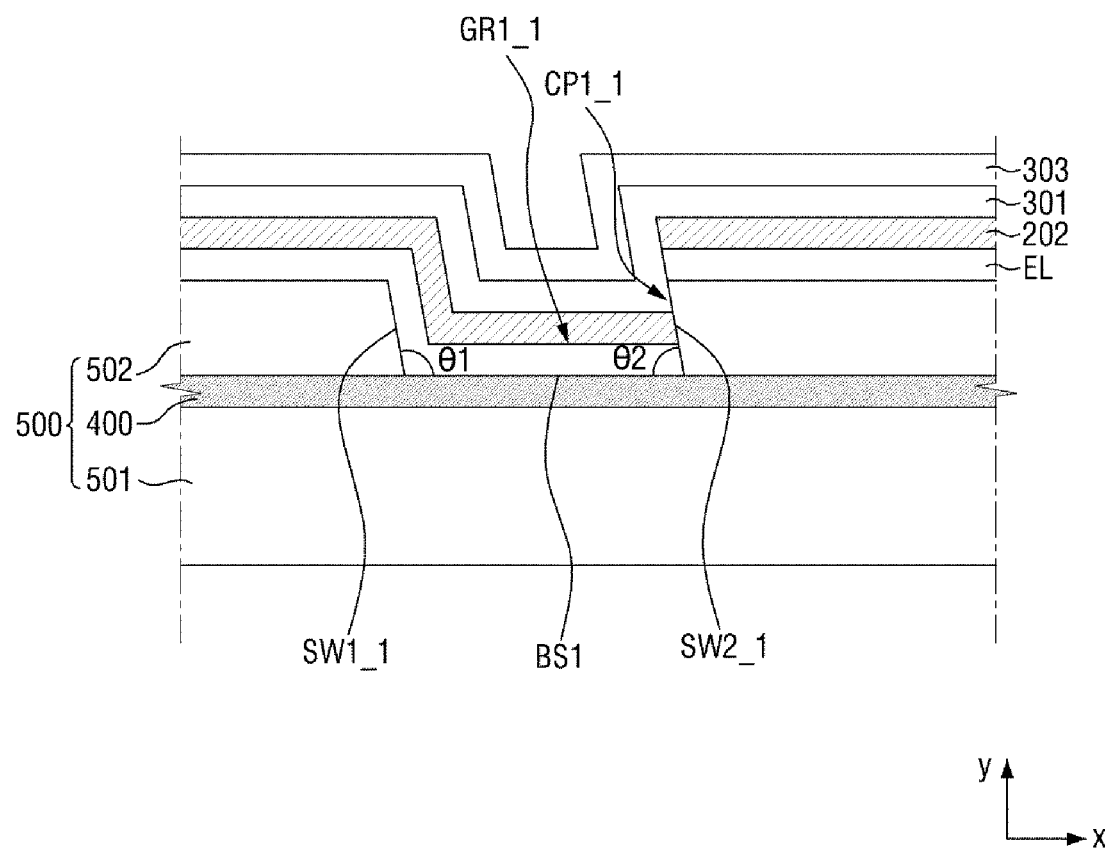
FIG. 6 is an enlarged view of a portion a display device according to an alternative embodiment.

In an embodiment, each of the first sidewall SW1 and the second sidewall SW2 has a positive slope, as shown in FIG. 5. In an alternative embodiment, each of the first sidewall SW1 and the second sidewall SW2 has a negative slope as shown in FIG. 6.

The organic layer EL may be disposed on the second substrate 502 and the first groove GR1. The organic layer EL disposed on the insulating substrate 500 may become a path along which moisture flows, such that moisture generated around the through hole H may flow into the display area DA through the organic layer EL, thereby causing a display defect.

In an embodiment, the organic layer EL is configured to be interrupted to prevent moisture from flowing into the display area DA through the organic layer EL. Here, the term 'interrupt' may be used in the sense of breaking the continuity of a continuous element. That is, if a continuous element is interrupted, it may become discontinuous, such that the element is divided into a plurality of portions disconnected from each other.

The organic layer EL may not be effectively interrupted when formed on a structure having a gentle slope due to high coverage thereof. When the first sidewall SW1 has a steep slope, the organic layer EL may be effectively interrupted, thus preventing moisture from flowing into the display area DA through the organic layer EL.

Accordingly, in an embodiment, interruption portions at which the organic layer EL is interrupted may be disposed in the barrier area BA.

In an embodiment, as shown in FIGS. 3 and 4, a first interruption portion CP1, a second interruption portion CP2 and a third interruption portion CP3 are defined in the barrier area BA to correspond to the first groove GR1, the second groove GR2 and the third groove GR3, respectively, but not being limited thereto. Alternatively, the number of interruption portions corresponding to grooves may be variously modified based on the number of grooves provided therein.

Hereinafter, the first interruption portion CP1 will be described in detail with reference to FIG. 5. Since the second interruption portion CP2 and the third interruption portion CP3 are substantially identical to the first interruption portion CP1, any repetitive detailed description thereof will be omitted for convenience of description.

In an embodiment, as shown in FIG. 5, the first interruption portion CP1 may be defined by the first sidewall SW1.

The first interruption portion CP1 that interrupts the organic layer EL may have a structure, in which a portion of the first sidewall SW1 may contact the organic layer EL, the remaining portion of the first sidewall SW1 may not contact the organic layer EL, and the whole of the bottom surface BS and the whole of the second sidewall SW2 may contact the organic layer EL.

The second electrode 202 may be disposed on the organic layer EL. In an embodiment, the second electrode 202 may be interrupted at the first interruption portion CP1. Accordingly, the second electrode 202 may directly contact the first sidewall SW1. The bottom surface BS and the second sidewall SW2 may not directly contact the second electrode 202 due to the organic layer EL.

In such an embodiment, the organic layer EL may not cover a portion of the first sidewall SW1, thus exposing the portion of the first sidewall SW1.

The first inorganic film 301 may be disposed on the second electrode 202. In an embodiment, the first inorganic film 301 may directly contact a portion of the first sidewall SW1 exposed by the second electrode 202 and the organic layer EL.

The second inorganic film 303 may be disposed on the first inorganic film 301. In such an embodiment, the first inorganic film 301 and the second inorganic film 303 may directly contact each other in the barrier area BA.

The second groove GR2 and the third groove GR3 may have substantially the same shape as the first groove GR1. Therefore, any repetitive detailed description of the second groove GR2 and the third groove GR3 will be omitted.

Referring back to FIG. 4, the through hole H may be disposed inside the barrier area BA. The through hole H may be defined entirely through the insulating substrate 500. Accordingly, an empty space may be defined in the hole area HA.

Hereinafter, alternative embodiments of display device will be described in detail. Hereinafter, elements of such embodiments that are identical to those described above are indicated by like reference numerals, and any repetitive detailed description thereof will be omitted or simplified.

FIG. 6 is a partial enlarged view of a display device according to an alternative embodiment. Referring to FIG. 6, in an embodiment, a first sidewall SW1_1 forms a first angle θ1 with a bottom surface BS1, and a second sidewall SW2_1 forms a second angle θ2 with the bottom surface BS1 in the first groove GR1_1. The embodiment shown in FIG. 6 is substantially the same as the embodiment shown in FIG. 5 except that the second angle θ2 formed by the second sidewall SW2_1 and the bottom surface BS1 is an acute angle.

In such an embodiment, the first angle θ1 formed by the first sidewall SW1_I and the bottom surface BS1 may be an obtuse angle, and the second angle θ2 formed by the second sidewall SW2_1 and the bottom surface BS1 may be an acute angle.

In such an embodiment, a first interruption portion CP1_1 may be defined at the second sidewall SW2_1. In such an embodiment, an organic layer EL may be interrupted. Accordingly, a portion of the second sidewall SW2_1 may contact the organic layer EL, and the remaining portion of the second sidewall SW2_1 may not contact the organic layer EL. In such an embodiment, the whole of the bottom surface BS and the whole of the first sidewall SW1_I may contact the organic layer EL.

A second electrode 202 may be disposed on the organic layer EL. In an embodiment, the second electrode 202 may be interrupted at the first interruption portion CP1_1. Accordingly, the second electrode 202 may directly contact the second sidewall SW2_1. The bottom surface BS and the first sidewall SW1_1 may not directly contact the second electrode 202 due to the organic layer EL.

In such an embodiment, the organic layer EL may not cover a portion of the second sidewall SW2_1, thus exposing the portion of the second sidewall SW2_1.

A first inorganic film 301 may be disposed on the second electrode 202. In an embodiment, the first inorganic film 301 may directly contact a portion of the second sidewall SW2_1 exposed by the second electrode 202 and the organic layer EL.

Figure 7:
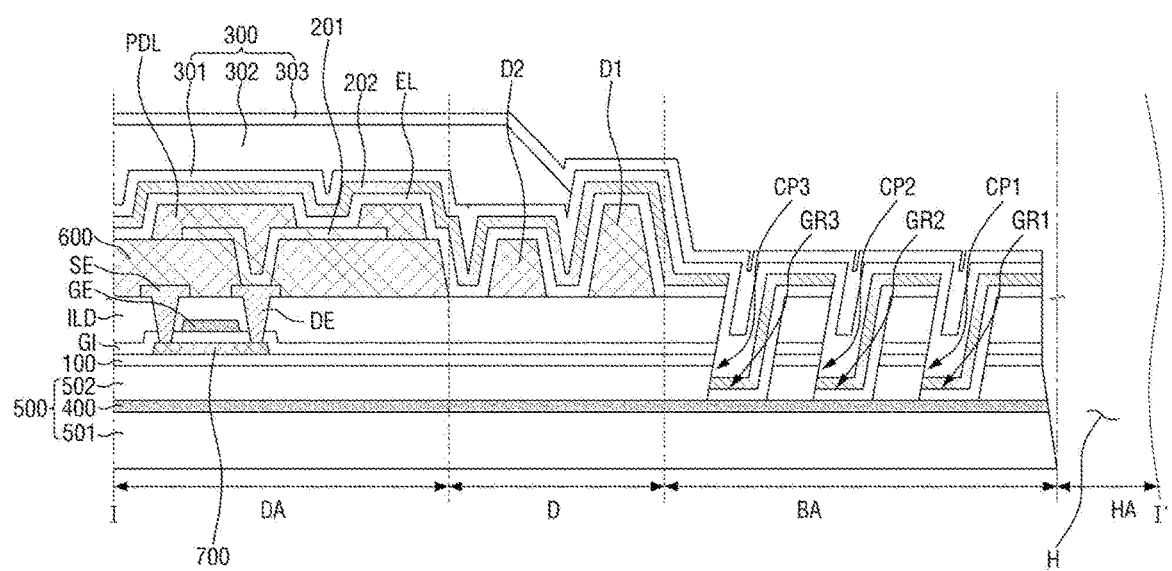
FIG. 7 is a cross-sectional view of a display device according to another alternative embodiment.

FIG. 7 is a cross-sectional view of a display device according to another alternative embodiment.

Referring to FIG. 7, an insulating film may be disposed in a portion of a barrier area BA where no grooves are defined.

In an embodiment, a buffer layer 100, a gate insulating film GI and an interlayer insulating film ILD may be disposed in a portion of the barrier area BA where a first groove GR1, a second groove GR2 and a third groove GR3 are not defined.

In an embodiment, as shown in FIG. 7, all of the buffer layer 100, the gate insulating film GI and the interlayer insulating film ILD are disposed in the portion of the barrier area BA where the first groove GR1, the second groove GR2 and the third groove GR3 are not defined. However, the invention is not limited to this case.

In an alternative embodiment, at least one of the buffer layer 100, the gate insulating film GI and the interlayer insulating film ILD may be disposed in the portion of the barrier area BA where the first groove GR1, the second groove GR2 and the third groove GR3 are not defined. In such an embodiment, at least one of the buffer layer 100, the gate insulating film GI and the interlayer insulating film ILD may be omitted.

Figure 8:
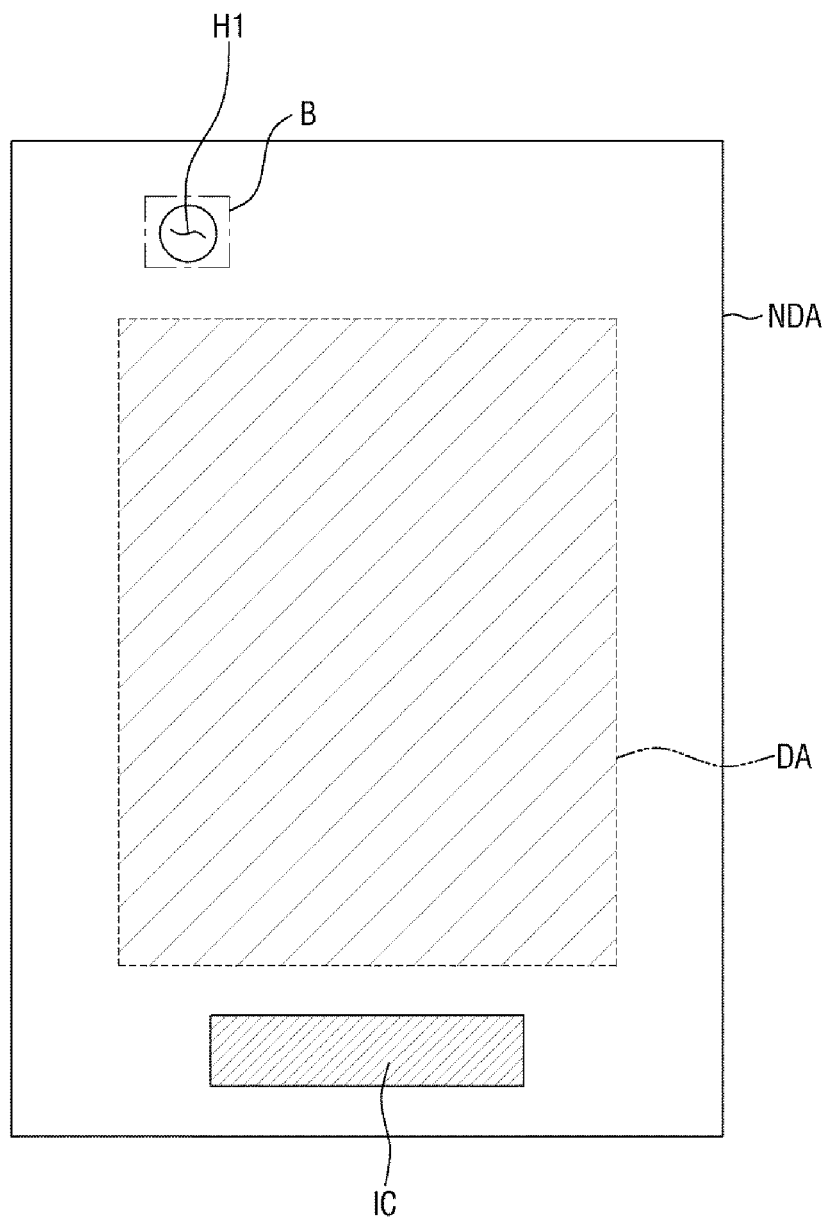
FIG. 8 is a schematic plan view of a display device according to another alternative embodiment.
Figure 9:
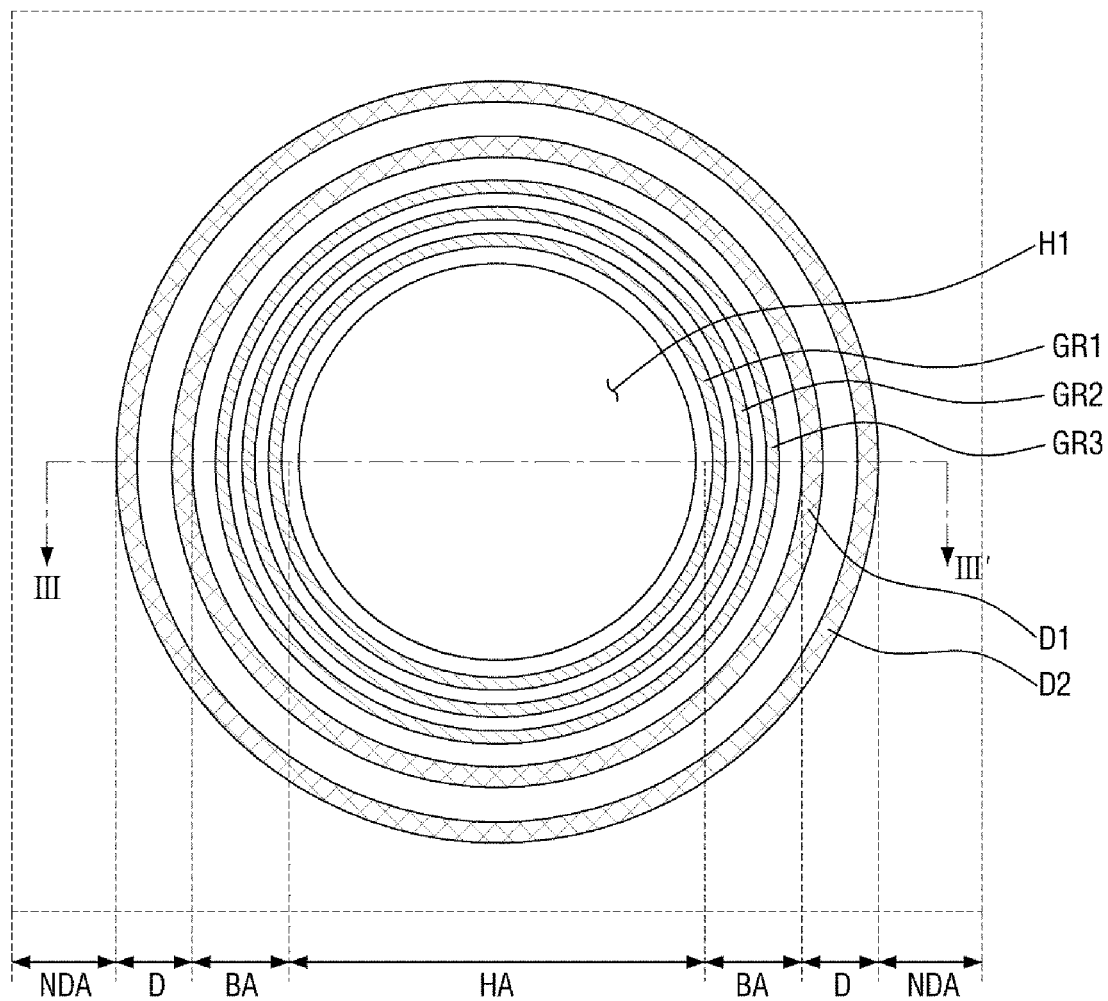
FIG. 9 is an enlarged view of a portion 'B' of FIG. 8.
Figure 10:
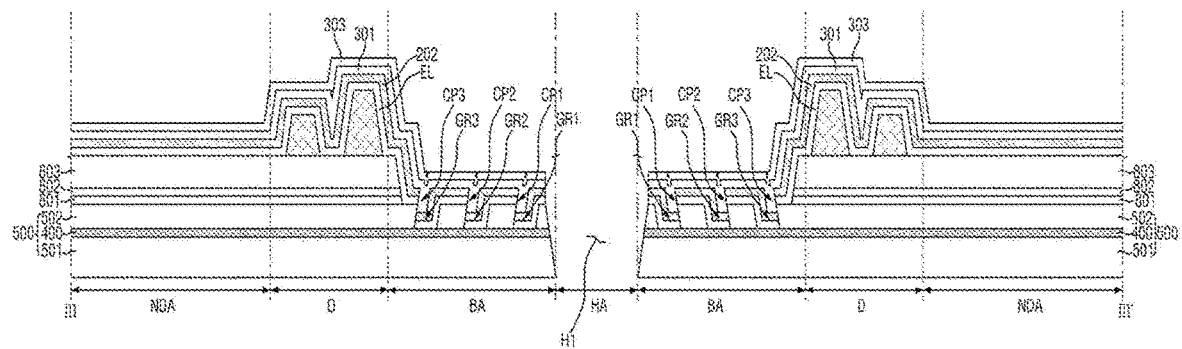
FIG. 10 is a cross-sectional view taken along line III-III' of FIG. 9.

FIG. 8 is a schematic plan view of a display device according to an alternative embodiment. FIG. 9 is an enlarged view of a portion 'B' of FIG. 8. FIG. 10 is a cross-sectional view taken along line III-III' of FIG. 9.

Referring to FIGS. 8 through 10, in an embodiment, a through hole H1 may be disposed in a non-display area NDA.

Referring to FIG. 8 through FIG. 10, the through hole H1 may be defined through an insulating substrate 500 in the non-display area NDA. A barrier area BA and a dam area D may be disposed around a hole area HA occupied by the through hole H1. In such an embodiment, the barrier area BA and the dam area D are substantially the same as those described above with reference to FIG. 2, and any repetitive detailed descriptions thereof will be omitted.

The non-display area NDA may be disposed outside the dam area D. Referring to FIG. 10, a first insulating film 801, a second insulating film 802, and a third insulating film 803 may be formed on a second substrate 502 in the non-display region NDA and the dam area D.

In an embodiment, the first insulating film 801 may include or be made of the same material as a buffer layer 100 of a display area DA, the second insulating film 802 may include or be made of the same material as a gate insulating film GI of the display area DA, and the third insulating film 803 may include or be made of the same material as a passivation film 600 of the display area DA.

In an embodiment, as shown in FIG. 10, an insulating film consisting of three layers is disposed in the non-display region NDA and the dam area D. However, the structure of the insulating film is not limited thereto. The insulating film may have a single layer structure or a multi-layer structure including a stack of four or more layers.

A first inorganic film 301 and a second inorganic film 303 may be disposed on the third insulating film 803 in the non-display area NDA. In such an embodiment, the first inorganic film 301 and the second inorganic film 303 may directly contact each other in the non-display area NDA.

However, the invention is not limited to this case. In an alternative embodiment, a first organic film 302 may be disposed between the first inorganic film 301 and the second inorganic film 303 (see FIG. 3).

A first dam D1 and a second dam D2 may be disposed on the third insulating film 803 in the dam area D. Since the first dam D1 and the second dam D2 are substantially the same as those described above with reference to FIG. 3, and any repetitive detailed descriptions thereof will be omitted.

Figure 11:
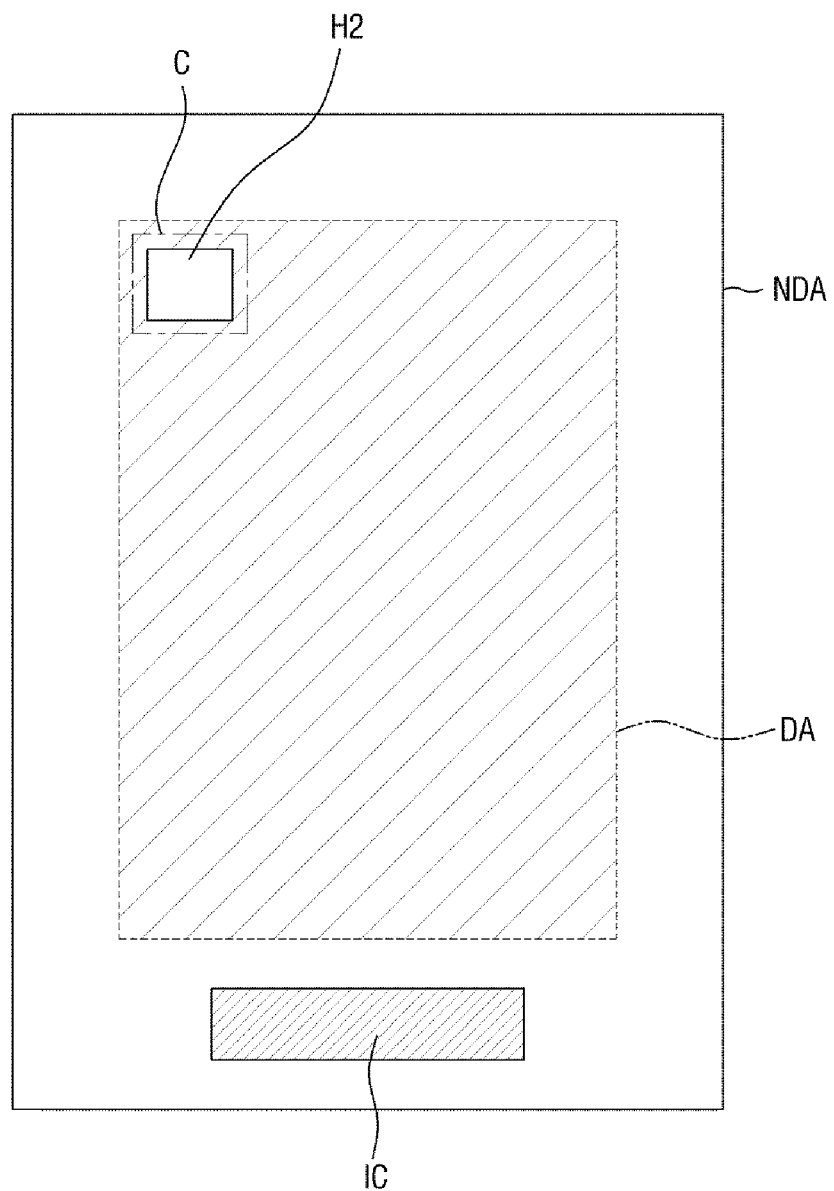
FIG. 11 is a schematic plan view of a display device according to another alternative embodiment.
Figure 12:
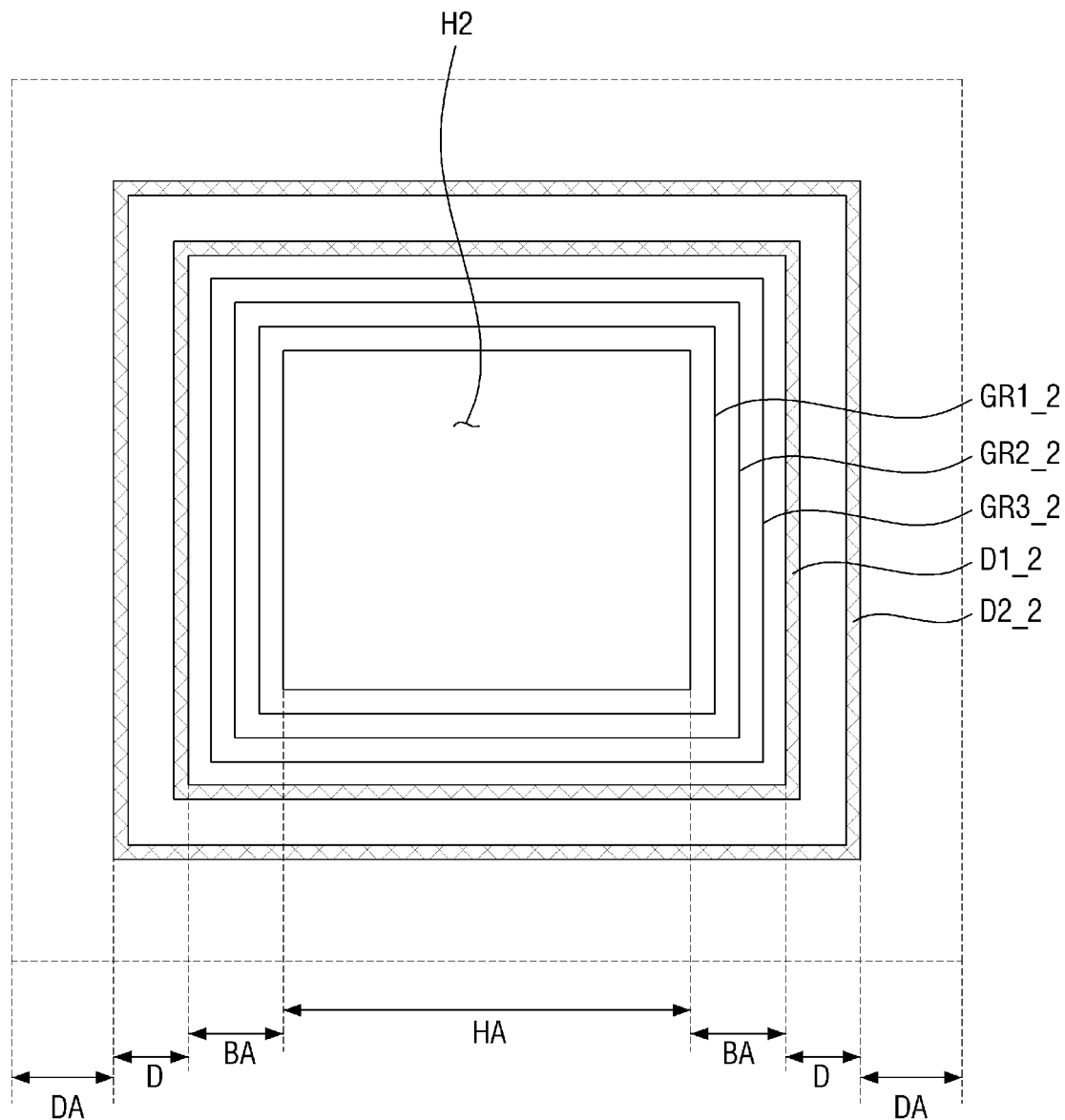
FIG. 12 is an enlarged view of a portion 'C' of FIG. 11.

FIG. 11 is a schematic plan view of a display device according to another alternative embodiment. FIG. 12 is an enlarged view of a portion 'C' of FIG. 11.

Referring to FIG. 11, in an embodiment, a through hole H2 may have a quadrilateral shape. In embodiments of the invention, the shape of the through hole H2 is not limited to a circular shape as described above.

Referring to FIG. 12, in an embodiment where the through hole H2 has a quadrilateral shape, a first groove GR1_2, a second groove GR2_2 and a third groove GR3_2 surrounding the through hole H2 may have a quadrilateral shape. In such an embodiment, the planar shape of the through hole H2 may be similar to the planar shapes of the first groove GR1_2, the second groove GR2_2 and the third groove GR3_2.

In such an embodiment where the through hole H2 has a quadrilateral shape, the planar shape of each of a first dam D1_2 and a second dam D2_2 may be a quadrilateral shape. The planar shape of the through hole H2 may be similar to the planar shapes of the first dam D1_2 and the second dam D2_2.

In an embodiment, as shown in FIG. 12, the planar shapes of the first groove GR1_2, the second groove GR2_2, the third groove GR3_2, the first dam D1_2 and the second dam D2_2 are quadrilateral shapes, and the through hole H2 has a quadrilateral shape. However, the planar shapes of the first groove GR1_2, the second groove GR2_2, the third groove GR3_2, the first dam D1 and the second dam D2 are not limited thereto.

In an alternative embodiment, the through hole H2 may have a quadrilateral shape, and the planar shapes of the first groove GR1_2, the second groove GR2_2, the third groove GR3_2, the first dam D1_2 and the second dam D2_2 may be circular shapes as in FIG. 2.

Hereinafter, an embodiment of a method of manufacturing a display device will be described. Some of the elements described below may be the same as or similar to those in the embodiments of the display device described above, and thus any repetitive detailed description of the same or similar elements will be omitted.

FIGS. 13 to 19 are views illustrating a method of manufacturing a display device according to an embodiment. Referring to FIGS. 13 through 20, an embodiment of the method of manufacturing a display device includes providing one or more dams D1 and D2 on a first area A1 of an insulating substrate 500 which is disposed on a carrier substrate G and in which the first area A1, a second area A2 and a third area A3 are defined: forming a laser cutting portion LC by irradiating a laser beam to the third area A3 in a first direction; forming one or more grooves in the insulating substrate 500) by irradiating a laser beam to the second area A2 in a second direction different from the first direction; and providing an organic layer EL on the insulating substrate 500 to partially cover the grooves.

Figure 13:
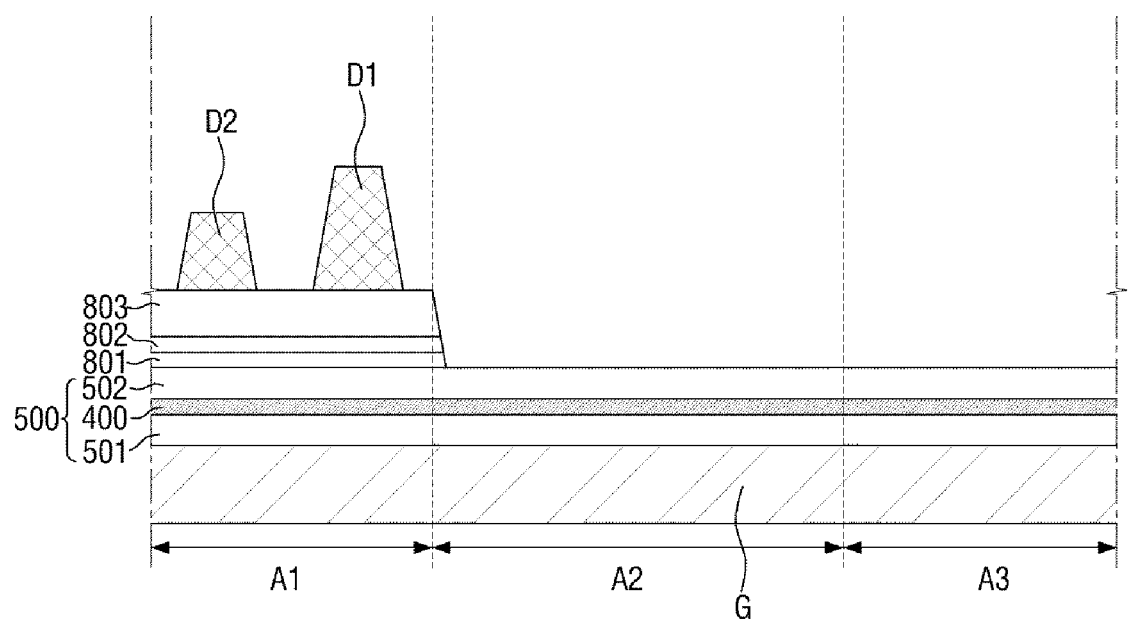
FIGS. 13 to 19 are views illustrating a method of manufacturing a display device according to an embodiment.

Referring to FIG. 13, one or more dams D1 and D2 are provided on the first area A1 of the insulating substrate 500 in which the first area A1, the second area A2 and the third area A3 are defined.

The insulating substrate 500 may be disposed on the carrier substrate G. The carrier substrate G may include a glass.

In an embodiment, the planar shape of the third area A3 may be a circular shape. In such an embodiment, a through hole H may be formed in the third area A3 during a subsequent process.

In such an embodiment, the third area A3 may correspond to the hole area HA of FIG. 2 or 12.

In such an embodiment, the first area A1 may correspond to the dam area D of FIG. 2 or 12, and the second area A2 may correspond to the barrier area BA of FIG. 2 or 12.

In an embodiment, one or more insulating films may be provided in the first area A1. The insulating films may include one or more of a first insulating film 801, a second insulating film 802 and a third insulating film 803.

In such an embodiment, no insulating film may be disposed in the second area A2 and the third area A3. In an embodiment, the insulating films may be provided over the entire surface of the insulating substrate 500, and then portions thereof corresponding to the second area A2 and the third area A3 may be removed. In an alternative embodiment, the insulating films may be formed only in the first area A1 using a mask.

In an embodiment, as shown in FIG. 13, no insulating film is provided in the second area A2 and the third area A3. However, the invention is not limited thereto. In an alternative embodiment, one or more of the first insulating film 801, the second insulating film 802 and the third insulating film 803 may be provided in the second area A2 and the third area A3 as in the first area A1.

In such an embodiment, a structure obtained through such processes to be described later may be as that illustrated in FIG. 7.

A first dam D1 and/or a second dam D2 may be provided on the third insulating film 803 of the first area A1.

In an embodiment, the first dam D1 may be formed with a pixel defining layer PDL of a display area DA during a same process, but not being limited thereto. In such an embodiment, the second dam D2 may be formed with a passivation film 600 of the display area DA during a same process (see FIG. 3).

Figure 14:
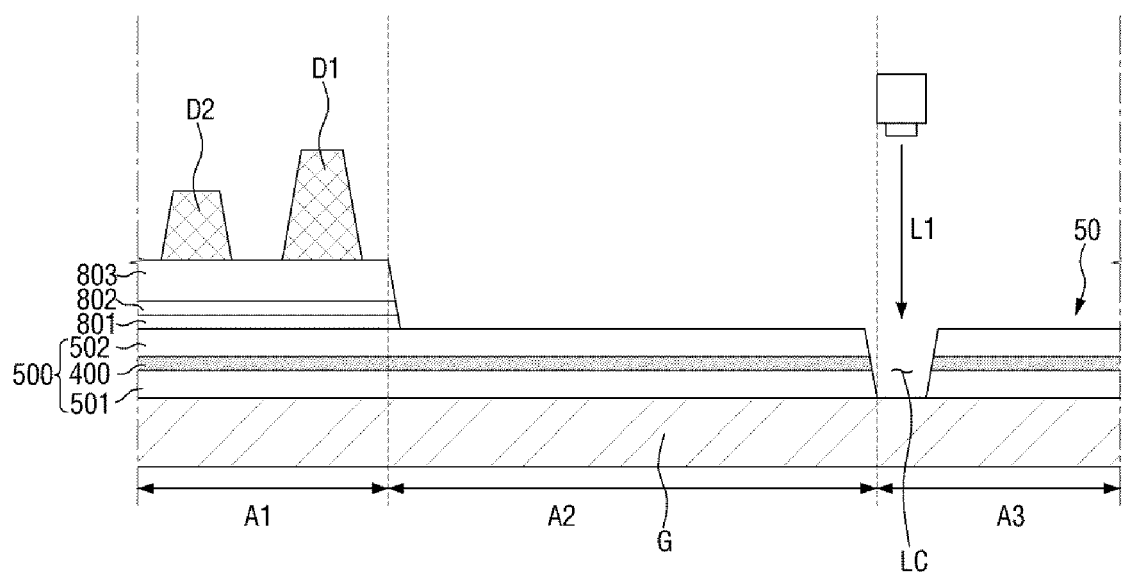

Referring to FIG. 14, the laser cutting portion LC may be formed by irradiating a laser beam to the third area A3 of the insulating substrate 500 in the first direction.

In an embodiment, the first direction may be a thickness direction of the insulating substrate 500, that is, a direction perpendicular to the insulating substrate 500. A first laser beam L1 irradiated in the first direction may completely penetrate the insulating substrate 500. In such an embodiment, the first laser beam L may form the laser cutting portion LC that completely passes through a first substrate 501, an inorganic layer 400 and a second substrate 502.

Figure 15:
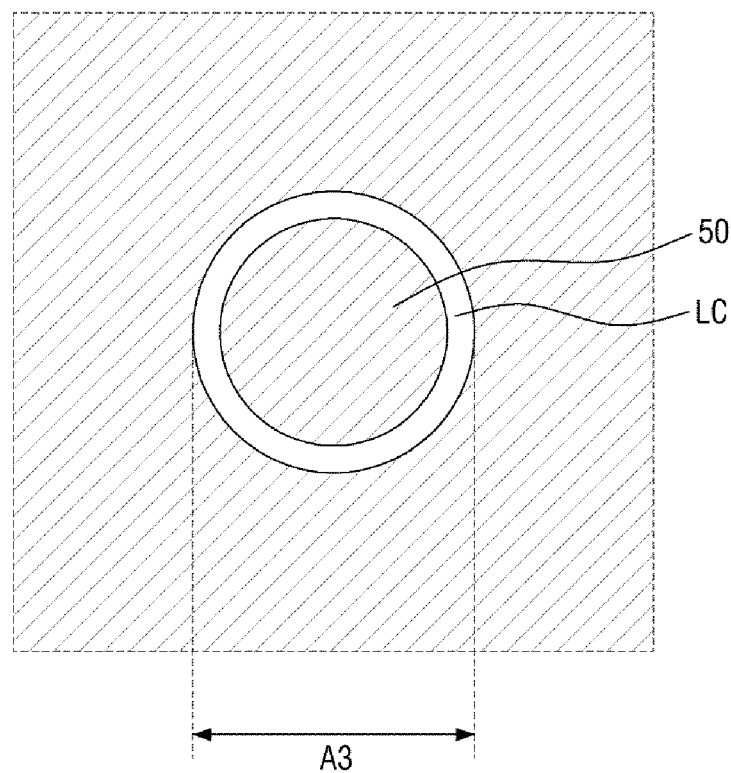

In an embodiment, the laser cutting portion LC may be shaped like a ring as illustrated in FIG. 15. In an alternative embodiment, the laser cutting portion LC may be shaped like a frame.

When the laser cutting portion LC is formed into a ring shape, an island pattern 50 may be formed inside the laser cutting portion LC. The island pattern 50 may be removed subsequently.

Figure 16:
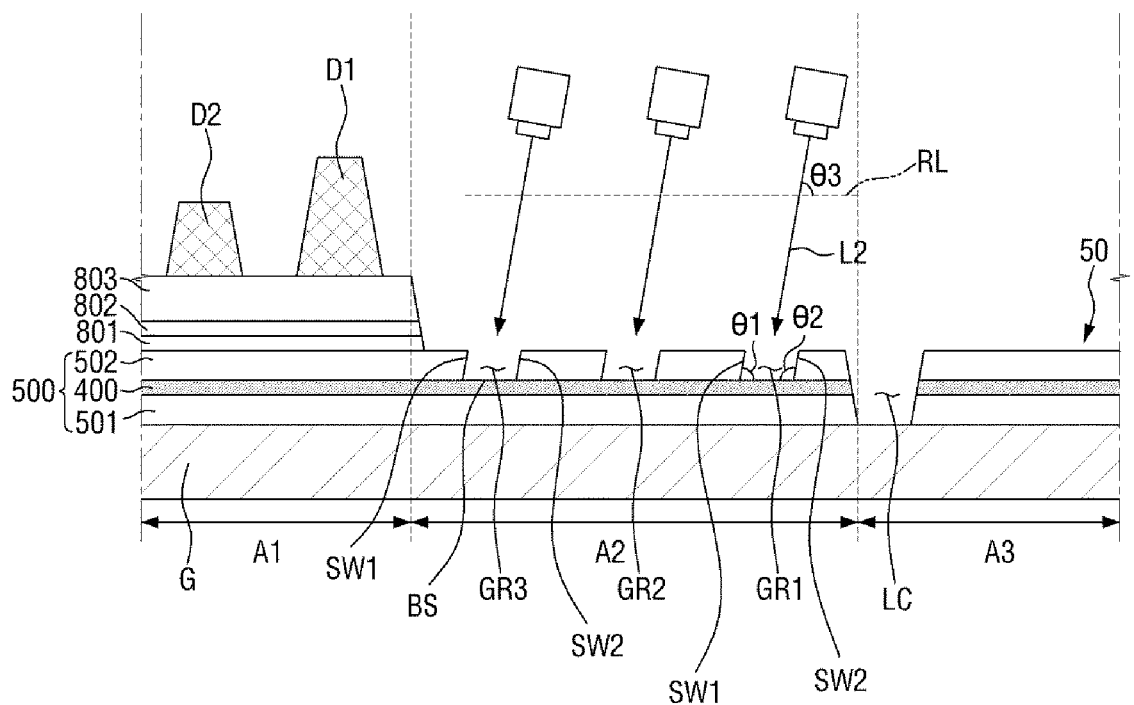

Referring to FIG. 16, one or more grooves GR1 through GR3, each having a first sidewall SW1, a second sidewall SW2 and a bottom surface BS, are formed in the insulating substrate 500 through the second substrate 502 by irradiating a laser beam to the second area A2 in the second direction different from the first direction.

The second direction may be different from the first direction. A reference plane RL is defined to describe the second direction. The reference plane RL may be an imaginary plane parallel to an upper surface of the insulating substrate 500.

The second direction, which is the irradiation direction of a second laser beam L2, may form a third angle θ3 with the reference plane RL. In an embodiment, the third angle θ3 may be substantially the same as a first angle θ1 formed by the first sidewall SW1 and the bottom surface BS.

In such an embodiment, the first angle θ1 and the third angle θ3 may be an acute angle.

The second laser beam L2 irradiated onto the insulating substrate 500 may penetrate the second substrate 502. However, the second laser beam L2 may not penetrate the inorganic layer 400 and the first substrate 501 because the inorganic layer 400 functions as a blocking layer.

The first groove GR1, the second groove GR2 and the third groove GR3 formed by the second laser beam L2 are substantially the same as those described above with reference to FIG. 5 or 6. Thus, any repetitive detailed description of the first groove GR1, the second groove GR2 and the third groove GR3 will be omitted.

In an embodiment, the second laser beam L2 may be provided in a plurality. In an embodiment, as shown in FIG. 16, the number of the second laser beams L2 is three. However, the number of the second laser beams L2 is not limited to three. In an alternative embodiment, the number of the second laser beams L2 may be one or may be four or more.

Figure 17:
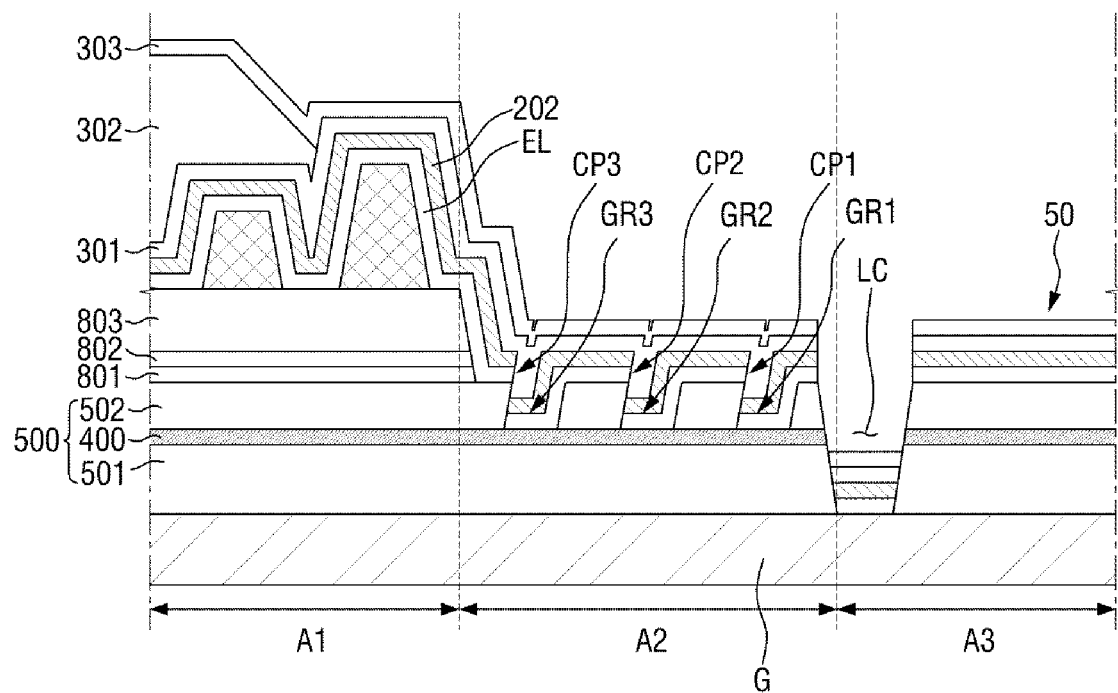

Referring to FIG. 17, an embodiment of the method of manufacturing a display device may further include providing the organic layer EL on the insulating substrate 500, providing a second electrode 202 on the organic layer EL, and providing an encapsulation film 300 on the second electrode 202.

In one embodiment, for example, the organic layer EL may be formed by a chemical vapor deposition method or an inkjet method, but not being limited thereto.

The organic layer EL may be provided or formed on the insulating substrate 500. Interruption portions CP1 through CP3 that interrupt the organic layer EL may be defined by one or more grooves formed in the second area A2, as described above with reference to FIG. 4.

In an embodiment, the second electrode 202 may be formed using a chemical vapor deposition method.

The second electrode 202 may have substantially the same structure as that of FIG. 3.

The encapsulation film 300 may be provided or formed on the second electrode 202. The encapsulation film 300 may include a first inorganic film 301, a first organic film 302 and a second inorganic film 303. The encapsulation film 300 may be substantially the same as that of FIG. 3.

Figure 18:
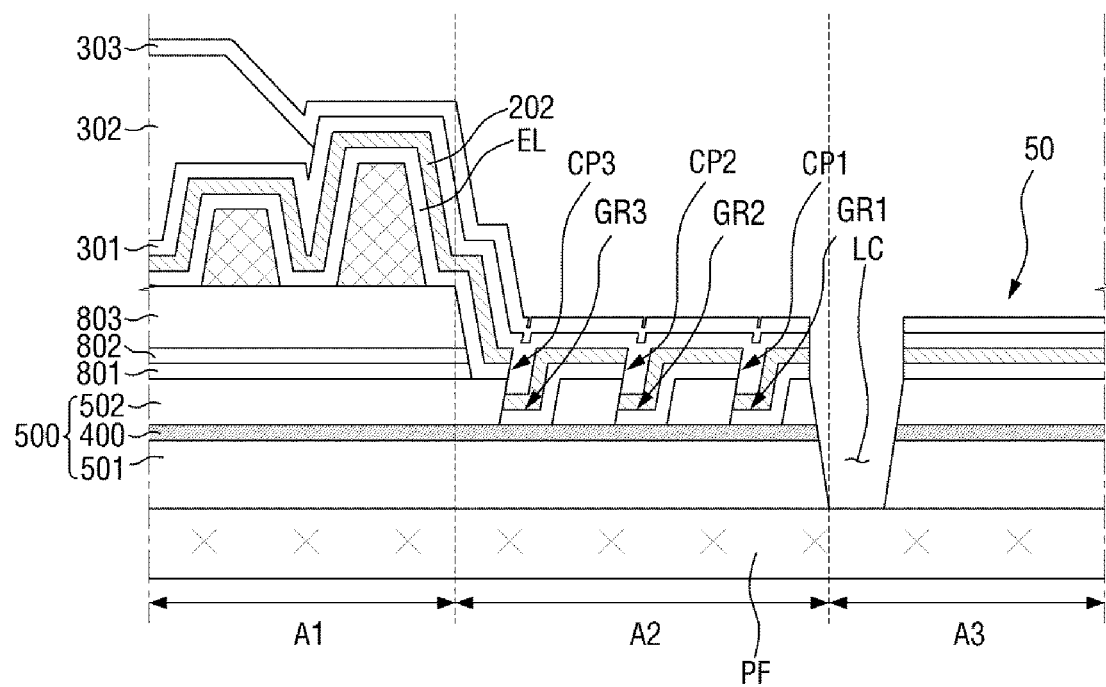

Referring to FIG. 18, an embodiment of the method of manufacturing a display device may further include detaching the carrier glass G from the insulating substrate 500, and attaching a protective film PF to the insulating substrate 500.

In the detaching of the carrier glass G, the island pattern 50 may be removed or may be left as illustrated in FIG. 18. However, even if the island pattern 50 is left, the island pattern will be removed during a subsequent process where the protective film PF is cut.

The protective film PF may be attached to a lower surface of the insulating substrate 500 to ensure stability in subsequent processes after the detaching the carrier glass G.

Figure 19:
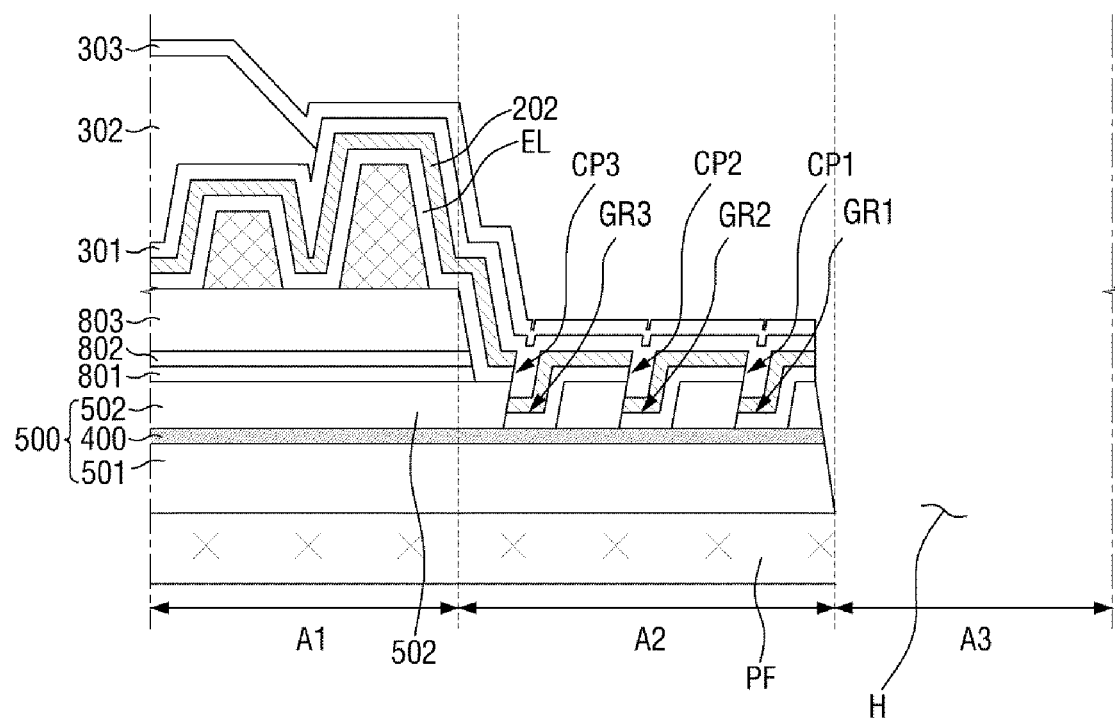
Figure 20:
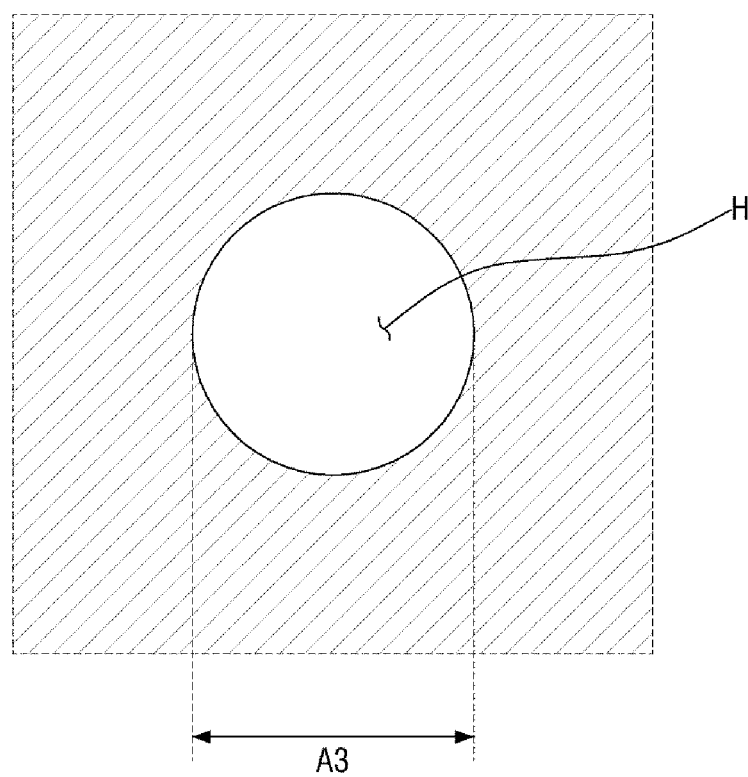
FIG. 20 is a plan view illustrating the method of manufacturing a display device according to the embodiment.

Referring to FIGS. 19 and 20, an embodiment of the method of manufacturing a display device may further include cutting the protective film PF.

In an embodiment, a portion of the protective film PF which corresponds to the third area A3 may be cut off. When the protective film PF is cut, the remaining island pattern 50 in the third area A3 thereon may be removed. Accordingly, the through hole H may be formed in the third area A3. The protective film PF may be cut along the laser cutting portion LC. As a result, the through hole H without the island pattern 50 may be formed as illustrated in FIG. 20.

In embodiments of the invention, moisture is effectively prevented from penetrating into a display area such that a display defect may be effectively prevented from occurring.

However, the effects of the embodiments are not limited to those forth herein. The above and other effects of the embodiments will become more apparent to one of ordinary skill in the art to which the embodiments pertain by referencing the claims.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A display device comprising:
    an insulating substrate comprising an active area, a through hole defined through the insulating substrate, and a barrier area surrounding the through hole; and
    an organic layer disposed in the active area and the barrier area of the insulating substrate,
    wherein at least one interruption portion, at which the organic layer is interrupted, is defined in the barrier area, and
    wherein the organic layer is uninterrupted in a top plan view in a thickness direction of the insulating substrate.

2. The display device of claim 1, wherein a first portion of the organic layer is disposed on the interruption portion.

3. The display device of claim 2,
    wherein a first area is defined between the adjacent interruption portions,
    wherein a second portion of the organic layer is disposed in the first area.

4. The display device of claim 3, wherein the first portion of the organic layer is not coupled to the second portion of the organic layer.

5. The display device of claim 3, wherein the organic layer comprises an organic light emitting layer.

6. The display device of claim 1, further comprising:
    a first electrode disposed in the active area, and
    a second electrode opposite to the first electrode,
    wherein the organic layer is disposed between the first electrode and the second electrode.

7. The display device of claim 6, further comprising:
    an encapsulation film disposed on the second electrode,
    wherein the encapsulation film comprises a first inorganic film, a first organic film disposed on the first inorganic film, and a second inorganic film disposed on the first inorganic film.

8. The display device of claim 7, further comprising:
    a dam disposed in the barrier area,
    wherein the dam does not overlap the first organic film, and the dam overlaps the first inorganic film and the second inorganic film.

9. The display device of claim 8, wherein the first inorganic film and the second inorganic film directly contact each other on the dam.

* * * * *